United States Patent
Oyamada

(10) Patent No.: US 8,299,518 B2
(45) Date of Patent: Oct. 30, 2012

(54) SEMICONDUCTOR DEVICE AND BYPASS CAPACITOR MODULE

(75) Inventor: Seisei Oyamada, Tokyo (JP)

(73) Assignee: Liquid Design Systems Inc., Yokohama, Kanagawa (JP)

( * ) Notice: Subject to any disclaimer, the term of this patent is extended or adjusted under 35 U.S.C. 154(b) by 0 days.

(21) Appl. No.: 13/135,434

(22) Filed: Jul. 5, 2011

(65) Prior Publication Data

US 2011/0260289 A1    Oct. 27, 2011

Related U.S. Application Data

(62) Division of application No. 12/077,177, filed on Mar. 17, 2008, now abandoned.

(51) Int. Cl.
*H01L 27/108* (2006.01)
*H01L 29/24* (2006.01)

(52) U.S. Cl. ......... 257/307; 257/516; 257/309; 257/528

(58) Field of Classification Search ................. 257/516, 257/307, 309, 723, 528, E23.153, E27.026; 361/301.2, 328, 313
See application file for complete search history.

(56) References Cited

U.S. PATENT DOCUMENTS

| | | | |
|---|---|---|---|
| 5,745,335 A | 4/1998 | Watt | |
| 5,811,868 A | 9/1998 | Bertin et al. | |
| 6,147,857 A | 11/2000 | Worley et al. | |
| 6,362,523 B1 | 3/2002 | Fukuda | |
| 6,411,494 B1 | 6/2002 | Watt | |
| 6,524,905 B2 | 2/2003 | Yamamichi et al. | |
| 6,549,396 B2 | 4/2003 | Brown | |
| 2002/0015293 A1* | 2/2002 | Akiba et al. | 361/793 |
| 2004/0165669 A1 | 8/2004 | Otsuka et al. | |

FOREIGN PATENT DOCUMENTS

| | | |
|---|---|---|
| JP | 02-202051 | 8/1990 |
| JP | 3-022470 | 1/1991 |
| JP | 05-055380 | 3/1993 |
| JP | 5-299584 | 11/1993 |
| JP | 10-189873 | 7/1998 |
| JP | 11-154733 | 6/1999 |
| JP | 2001-060664 | 3/2001 |
| JP | 2002-033453 | 1/2002 |
| JP | 2007-095965 | * 4/2007 |

OTHER PUBLICATIONS

Japanese Office Action dated Sep. 14, 2011 in Japanese Patent Application No. 2005-282899 (in Japanese).

* cited by examiner

*Primary Examiner* — Telly Green
(74) *Attorney, Agent, or Firm* — Collard & Roe, P.C.

(57) ABSTRACT

A semiconductor device includes an Si substrate having a first surface provided with semiconductor elements, such as a CMOS transistor and a diode, and a second surface opposite to the first surface. On one of the first and the second surfaces, a bypass capacitor is formed. The bypass capacitor includes a Vcc power supply layer and a GND layer which serve to supply a power supply voltage to the semiconductor element, and a high dielectric constant layer sandwiched between the Vcc power supply layer and the GND layer.

5 Claims, 12 Drawing Sheets

| High Dielectric Constant Material | Relative Dielectric Constant $\varepsilon$ |
|---|---|
| BCB Organic Organic | 2.7 |
| Polyimide Organic | 3.6 |
| Silicon Dioxide: $SiO_2$ | 3.7 |
| Diamond-like Carbon: $SP_2 + SP_3C$ | 4.5 |
| Magnesium Fluoride: $MgF$ | 5.0 |
| Silicon Nitride: $Si_3N_4$ | 7.0 |
| Silicon Nitride: $AlN$ | 9.0 |
| Aluminum Oxide: $Al_2O_3$ | 9.0 |
| Amorphous Tantalum Oxide: $Ta_2O_3$ | 23.0 |
| Silicon Carbide: $SiC$ | 40.0 |
| Hexagonal Tantalum Oxide: $Ta_2O_5$ | 50.0 |
| Titanium Oxide: $TiO_3$ | 50.0 |
| Barium Strontium Titanate (BST): $BaSrTiO_3$ | >1000 |
| Lead Zirconate Titanate (PZT): $PbZr(n)Ti(1-n)O_3$ | >2000 |
| BPZT: $Ba_{0.8}Pb_{0.2}(Zr_{0.12}Ti_{0.88})O_3$ | >3300 |
| Barium Titanate: $BaTiO_3$ | >5000 |

FIG. 4

SEMICONDUCTOR DEVICE AND BYPASS CAPACITOR MODULE

CROSS REFERENCE TO RELATED APPLICATIONS

This application is a divisional of and Applicant claims priority under 35 U.S.C. §§120 and 121 on U.S. application Ser. No. 12/077,177 filed on Mar. 17, 2008, the disclosure of which is hereby incorporated by reference.

BACKGROUND OF THE INVENTION

This invention relates to a semiconductor device and a bypass capacitor module and, in particular, to a semiconductor device and a bypass capacitor module which are capable of low-impedance driving a semiconductor element with a low-cost structure over an operation range from a low-frequency operation to a high-frequency operation.

When an IC (semiconductor integrated circuit) is packaged on a substrate, a capacitor is mounted on or adjacent to the IC. The capacitor serves to prevent occurrence of a malfunction caused by noise generated inside the IC and is called a bypass capacitor (for example, see Japanese Unexamined Patent Application Publication (JP-A) No. H2-202051).

Referring to FIG. 1, description will be made of a structure in which a bypass capacitor is mounted adjacent to an IC. As illustrated in FIG. 1, ICs 300 and 301 are fixed to a substrate (organic PCB) 400. Bypass capacitors 401 are mounted on the substrate 400 and externally bonded to the substrate 400 by wire bonding to suppress fluctuation of a power supply voltage supplied to the ICs 300 and 301, although a bonding wire is not shown in FIG. 1.

Referring to FIG. 2, description will be made of a structure in which a bypass capacitor is mounted on an IC. As illustrated in FIG. 2, an IC 500 is fixed to a substrate (organic PCB) 600. Bypass capacitors 501 are mounted on the IC 500 and externally connected to the IC 500 by bonding wires to suppress fluctuation of a power supply voltage supplied to the IC 500.

SUMMARY OF THE INVENTION

With the above-mentioned structure, however, there is an operating limit at a high frequency depending on an inductance component of the bonding wires. In order to improve such an operating limit related to a high frequency operation, the capacitor must have a large capacitance. This results in an increase in cost and size of the capacitor.

In view of the above, it is an object of this invention to provide a semiconductor device and a bypass capacitor module which are capable of low-impedance driving a semiconductor element with a low-cost structure over an operation range from a low-frequency operation to a high-frequency operation.

According to this invention, there is provided a semiconductor device including a substrate having a first surface and a second surface opposite to the first surface, a semiconductor element formed on the first surface of the substrate, and a bypass capacitor formed on one of the first and the second surfaces of the substrate. The bypass capacitor comprises a power supply layer and a ground layer which serve to supply a power supply voltage to the semiconductor element, and a high dielectric constant layer sandwiched between the power supply layer and the ground layer.

Preferably, the bypass capacitor is formed on the first surface of the substrate.

Preferably, the bypass capacitor is formed on the second surface of the substrate.

Preferably, the power supply layer is separated into a plurality of sections corresponding to a plurality of circuit blocks, respectively.

Preferably, the semiconductor element is a P-channel MOS transistor having a source electrode connected to the power supply layer and a drain electrode connected to the ground layer.

Preferably, the semiconductor element is an N-channel MOS transistor having a drain electrode connected to the power supply layer and a source electrode connected to the ground layer.

Preferably, the semiconductor element is a CMOS transistor comprising a P-channel MOS transistor and an N-channel MOS transistor. The P-channel MOS transistor has a source electrode connected to the power supply layer. The N-channel MOS transistor has a source electrode connected to the ground layer.

Preferably, the semiconductor element is a diode having an anode electrode connected to one of the power supply layer and the ground layer and a cathode electrode connected to the other of the power supply layer and the ground layer.

Preferably, the bypass capacitor has a module structure.

Preferably, the power supply layer and the ground layer of the bypass capacitor are connected to the substrate via bonding wires.

Preferably, the power supply layer and the ground layer of the bypass capacitor are connected to the substrate via solder balls.

According to this invention, there is also provided a bypass capacitor module to be mounted on a substrate of a semiconductor device. The bypass capacitor module comprises a power supply layer and a ground layer which serve to supply a power supply voltage to a semiconductor element formed on the substrate; and a high dielectric constant layer sandwiched between the power supply layer and the ground layer.

Preferably, the bypass capacitor module has a sheet-like structure.

Preferably, the power supply layer and the ground layer are connected to the substrate via bonding wires.

Preferably, the power supply layer and the ground layer are connected to the substrate via solder balls.

According to this invention, there is provided a semiconductor device including a substrate having a first surface and a second surface opposite to the first surface, a semiconductor element formed on the first surface of the substrate, and a bypass capacitor which is internally formed between a power supply layer and a ground layer.

According to this invention, there is provided a semiconductor device including a substrate having a first surface and a second surface opposite to the first surface, a semiconductor element formed on the first surface of the substrate, and a bypass capacitor formed on one of the first and the second surfaces of the substrate. The bypass capacitor comprises a power supply layer and a ground layer which serve to supply a power supply voltage to the semiconductor element, and a high dielectric constant layer sandwiched between the power supply layer and the ground layer. Therefore, it is possible to provide a semiconductor device and a bypass capacitor module which are capable of low-impedance driving a semiconductor element with a low-cost structure over an operation range from a low-frequency operation to a high-frequency operation.

BRIEF DESCRIPTION OF THE DRAWINGS

FIG. 4 shows various materials having a high dielectric constant and relative dielectric constants thereof;

DESCRIPTION OF THE EXEMPLARY EMBODIMENTS

Figure 1:
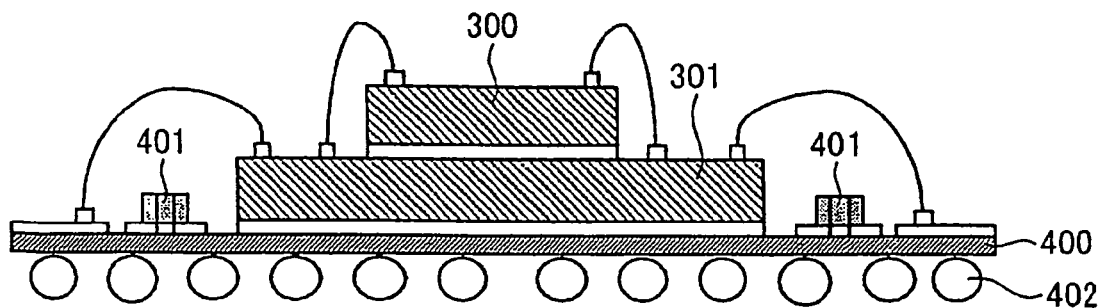
FIG. 1 is a view for describing a structure in which a bypass capacitor is mounted adjacent to an IC.
Figure 2:
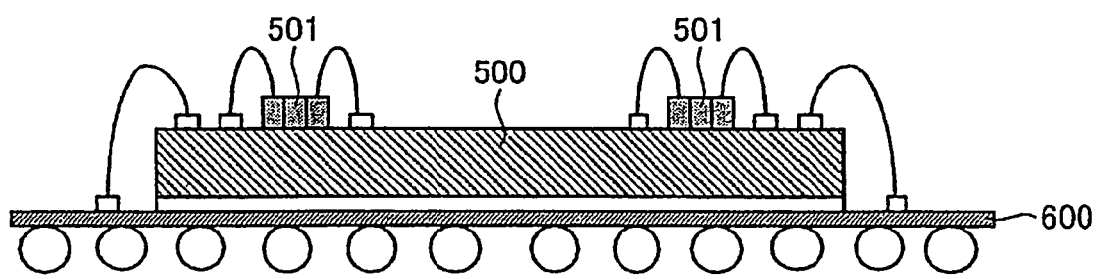
FIG. 2 is a view for describing a structure in which a bypass capacitor is mounted on an IC.

Now, several exemplary embodiments will be described with reference to the drawing. It is noted here that this invention is not limited to the following embodiments. Components in the following embodiments encompass those which are readily envisaged by a skilled person or those which are substantially equivalent.

First Embodiment

Referring to FIGS. 3A to 5F, a semiconductor device according to a first embodiment will be described. In the semiconductor device according to the first embodiment, a CMOS transistor and a diode are mounted on a substrate as semiconductor elements.

Figure 3A:
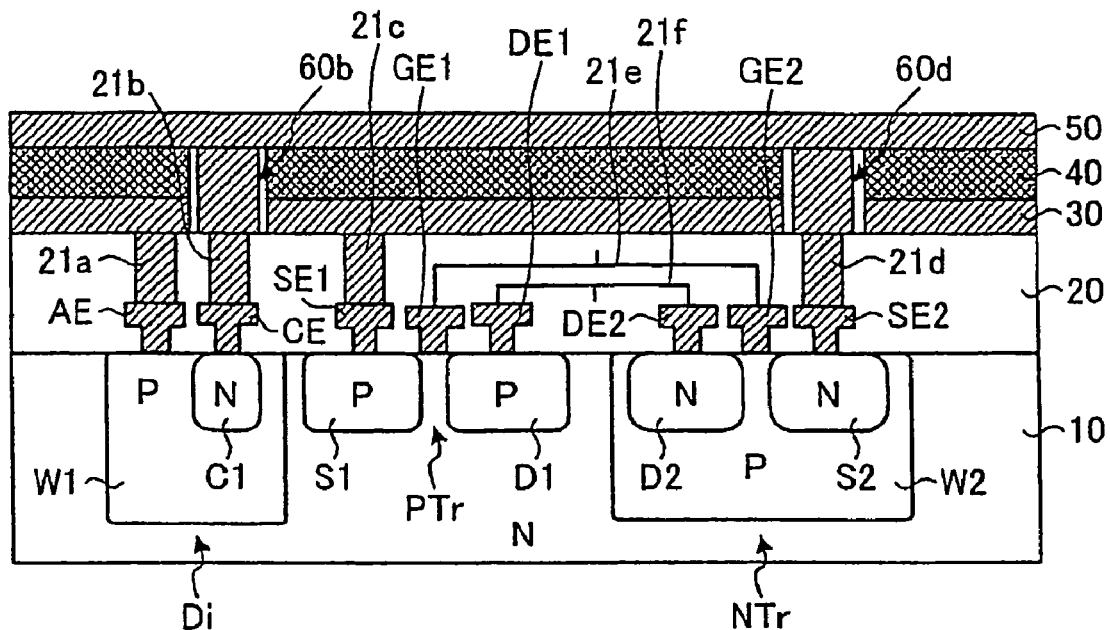
FIG. 3A is a sectional view of a characteristic part of a semiconductor device according to a first embodiment of this invention.

Referring to FIG. 3A, a Si substrate 10 is doped with an N-type dopant of a low concentration. The Si substrate 10 is provided with a CMOS transistor and a diode D1. The CMOS transistor comprises a P-channel MOS transistor PTr and an N-channel MOS transistor NTr in an integrated structure.

The P-channel MOS transistor PTr comprises a source region S1 and a drain region D1 which are formed by diffusing a P-type dopant of a high concentration, a source electrode SE1, a drain electrode DE1, and a gate electrode GE1. Although not shown in all of figures for simplicity of illustration, it is to be noted that a gate insulating film underlies each gate electrode, such as GE1.

The N-channel MOS transistor NTr comprises a P-type well W2 for forming the N-channel MOS transistor, a source region S2 and a drain region D2 formed by diffusing an N-type dopant of a high concentration into the P-type well W2, a source electrode SE2, a drain electrode DE2, and a gate electrode GE2.

A combination of the P-channel MOS transistor PTr and the N-channel MOS transistor Ntr forms the CMOS transistor with the gate electrodes GE1 and GE2 connected via a wire 21e and the drain electrodes DE1 and DE2 connected via a wire 21f.

The diode Di comprises a P-type well W1 for forming the diode, an N-type region C1 formed by diffusing an N-type dopant of a high concentration into the P-type well W1, an anode electrode AE, and a cathode electrode CE.

On the Si substrate 10, an insulating layer (wiring layer) 20 of $SiO_2$ is formed. The insulating layer 20 is provided with contact holes and various wires, including a wire 21a connecting a Vcc power supply layer 30 and the anode electrode AE, a wire 21b connecting a GND layer 50 and the cathode electrode CE, a wire 21c connecting the Vcc power supply layer 30 and the source electrode SE1, and a wire 21d connecting the GND layer 50 and the source electrode SE2.

On the insulating layer 20, the Vcc power supply layer 30 is formed. The Vcc power supply layer 30 serves to supply a bias voltage Vcc to the source electrode SE1 of the P-channel MOS transistor PTr and the anode electrode AE of the diode Di. On the Vcc power supply layer 30, a high dielectric constant layer 40 is formed. On the high dielectric constant layer 40, the GND layer 50 is formed. The GND layer 50 serves to supply a ground potential to the source electrode SE1 of the N-channel MOS transistor NTr and the cathode electrode CE of the diode Di.

In the semiconductor device having the above-mentioned structure, a combination of the Vcc power supply layer 30, the GND layer 50, and the high dielectric constant layer 40 sandwiched between the Vcc power supply layer 30 and the GND layer 50 forms a bypass capacitor. Thus, by forming the bypass capacitor formed by the Vcc power supply layer 30, the GND layer 50, and the high dielectric constant layer 40, the bypass capacitor having a large capacitance is obtained. In order to increase the capacitance of the bypass capacitor, the high dielectric constant layer 40 is made of a high dielectric constant material. For example, high dielectric constant materials shown in FIG. 4 may be used. In FIG. 4, the high dielectric constant materials which are usable and relative dielectric constants thereof are shown. It is desired that the high dielectric constant material for use as the high dielectric constant layer 40 has a relative dielectric constant (e) not smaller than 10.

Figure 3B:
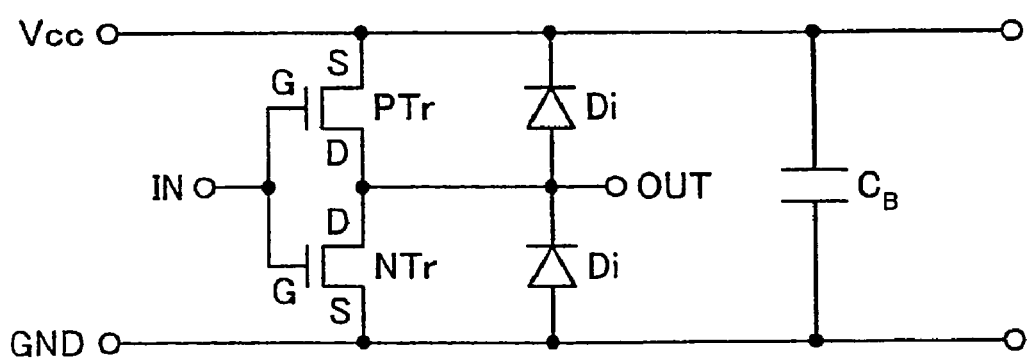
FIG. 3B is a view showing an equivalent circuit of the semiconductor device illustrated in FIG. 3A.

Referring to FIG. 3B, an equivalent circuit of the semiconductor device in FIG. 3A is illustrated. In the figure, a low impedance is formed between Vcc and GND by a bypass capacitor CB. Consequently, between the source S of the P-channel MOS transistor PTr and the source S of the N-channel MOS transistor NTr and between an anode and a cathode of the diode D1, a low-impedance power supply voltage is supplied over an operation range from a low-frequency operation to a high-frequency operation. As a consequence, it is possible to prevent fluctuation of the power supply voltage caused by a source-drain current at the time instant when an input signal IN is turned from a low level to a high level.

Referring to FIGS. 5A to 5F, description will be made of a process of producing the semiconductor device illustrated in FIG. 3A. At first, as illustrated in FIG. 3A, the P-type dopant is ion-implanted to a surface of the N-type Si substrate 10 to form the P-type well W1 for forming the diode Di, the P-type well W2 for forming the P-channel MOS transistor PTr, and the source region S1 and the drain region D1 of the P-channel MOS transistor PTr. Then, the N-type dopant is ion-implanted to form the source region S2 and the drain region D2 of the N-channel MOS transistor NTr and the N-type region C1 of the diode Di.

Figure 5A:
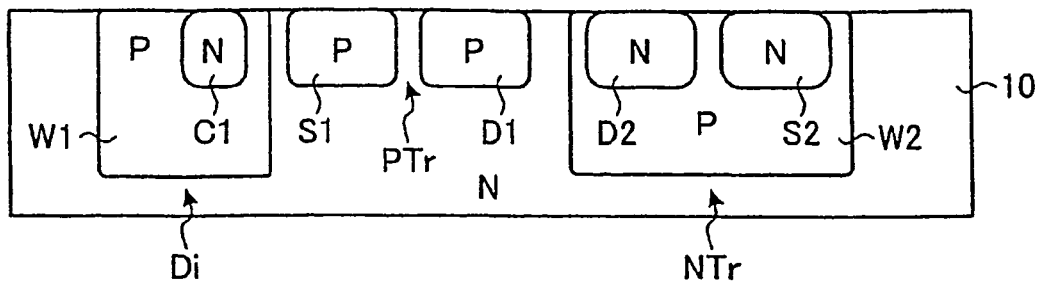
FIGS. 5A to 5F are sectional views for describing a process of producing the semiconductor device according to the first embodiment.
Figure 5B:
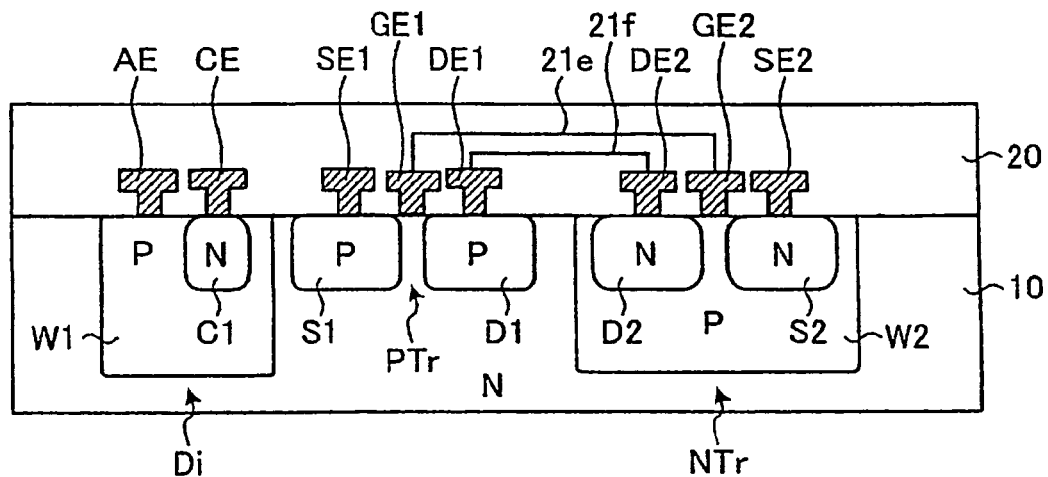

Next, as illustrated in FIG. 5B, the electrodes AE, CE, SE1, GE1, DE1, SE2, GE2, and DE2 and the wires 21e and 21f are formed by patterning using a metal such as Al. By spin coating, sputtering, CVD, or the like, $SiO_2$ is deposited to form the insulating layer 20.

Figure 5C:
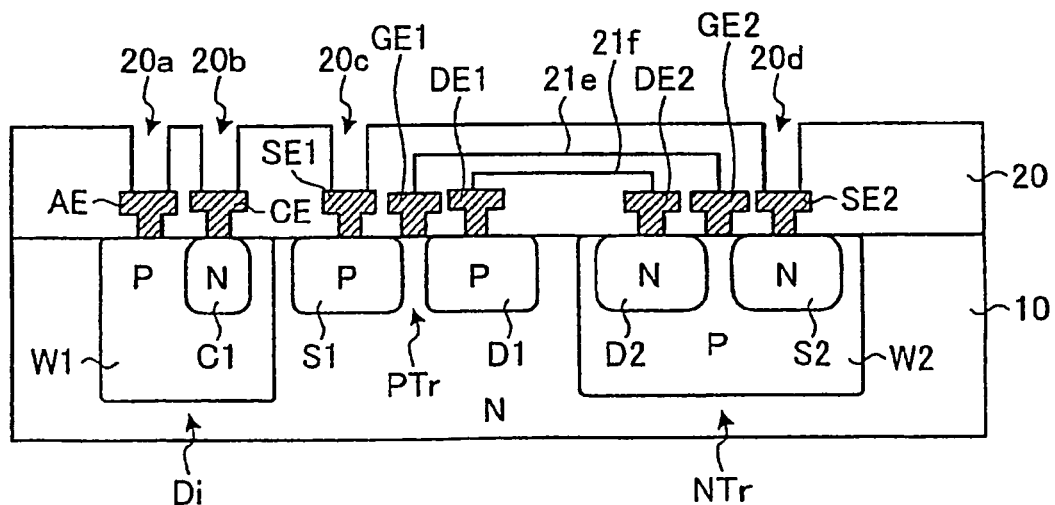
Figure 5D:
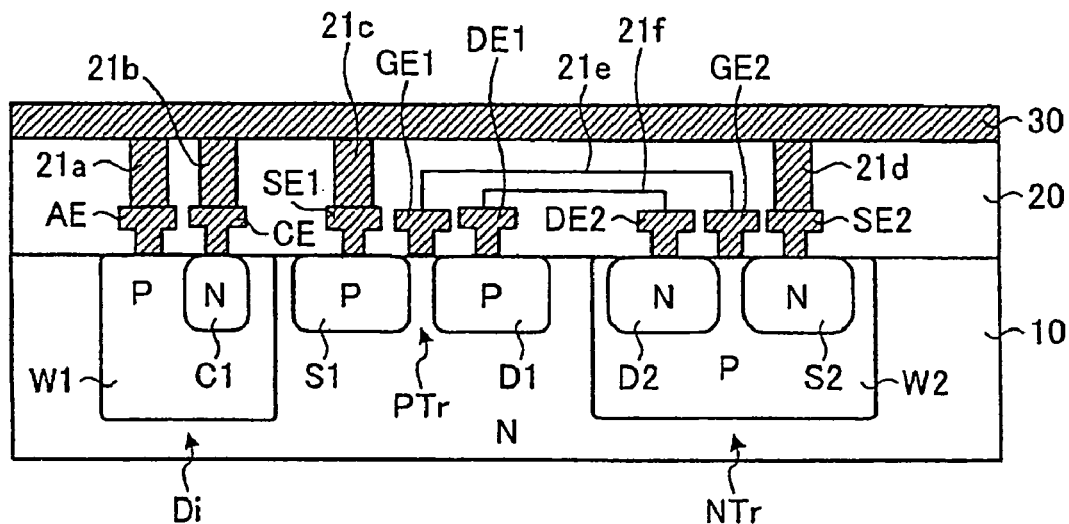

After the insulating layer 20 is formed, contact holes 20a to 20d are formed in the insulating layer 20 by etching as illustrated in FIG. 5C. Thereafter, as illustrated in FIG. 5D, a metal such as Al is deposited by sputtering, CVD, or the like into openings of the contact holes 20a to 20d and on a surface of the insulating layer 20 to form the wires 21a to 21d and the Vcc power supply layer 30.

Figure 5E:
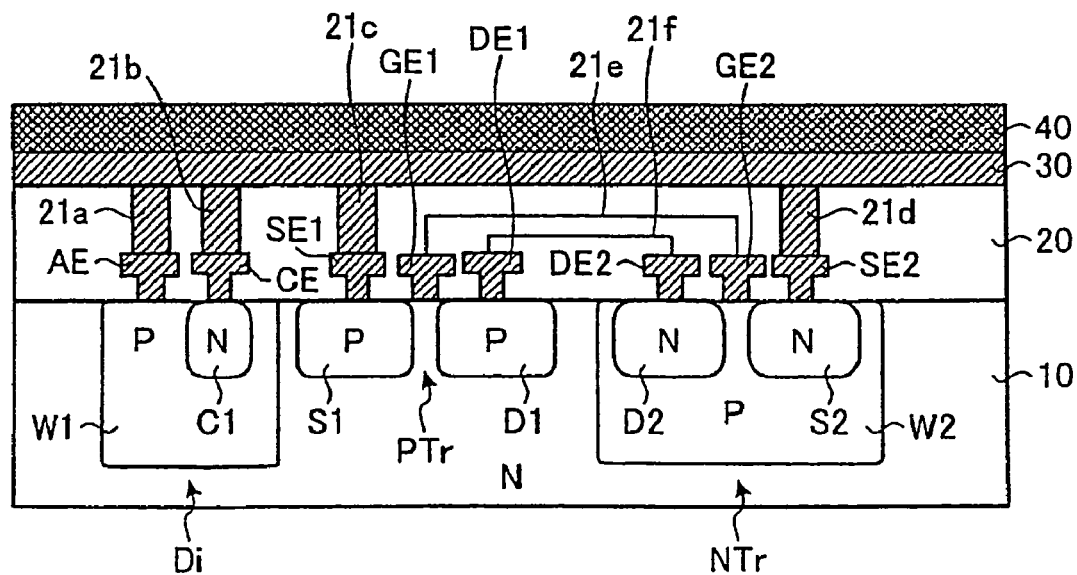
Figure 5F:
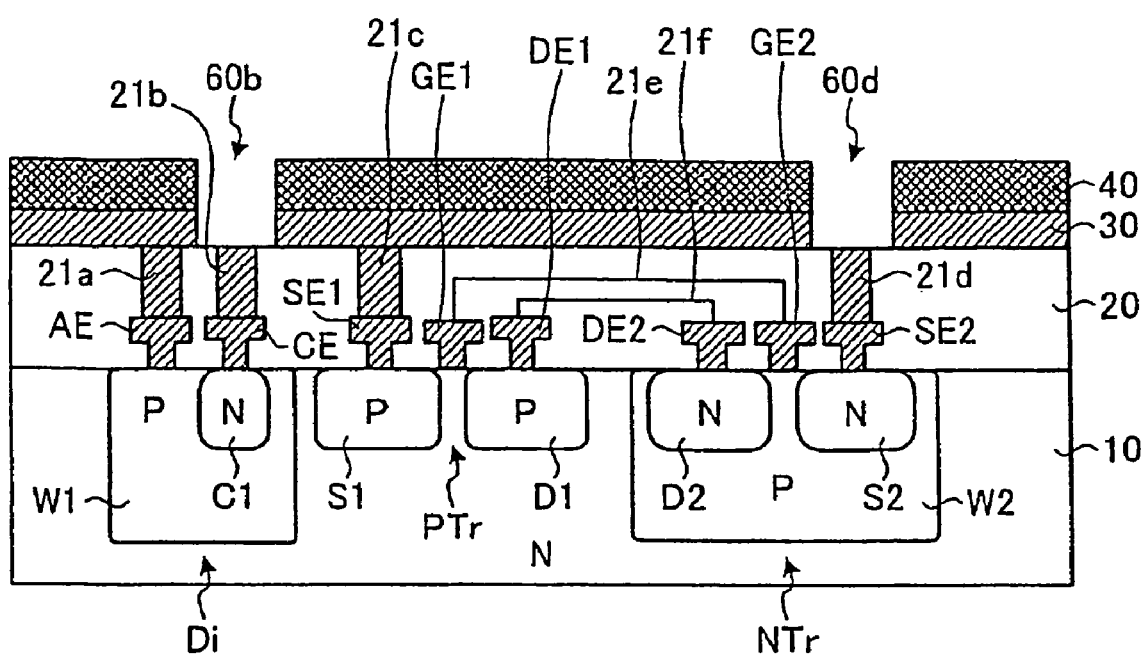

After the Vcc power supply layer 30 is formed, a high dielectric constant material is deposited on the Vcc power supply layer 30 by spin coating, sputtering, CVD, or the like to form the high dielectric constant layer 40 as illustrated in FIG. 5E. After the high dielectric constant layer 40 is formed, contact holes 60b and 60d are formed by etching in the Vcc power supply layer 30 and the high dielectric constant layer 40 as illustrated in FIG. 5F and the contact holes 60b and 60d are subjected to insulation processing.

In openings of the contact holes 60b and 60d and on a surface of the high dielectric constant layer 40, a metal such as Al is deposited by sputtering, CVD, or the like to form the GND layer 50. Thus, the semiconductor device illustrated in FIG. 3A is produced.

According to the first embodiment, the Si substrate 10 having the semiconductor elements (the CMOS transistor and the diode) is provided with the bypass capacitor comprising the Vcc power supply layer 30 and the GND layer 50 which serve to supply a power supply voltage to the semiconductor elements, and the high dielectric constant layer 40 sandwiched between the Vcc power supply layer 30 and the GND layer 50. Therefore, between Vcc and GND, a low impedance is formed by the bypass capacitor. It is therefore possible to supply a low-impedance power supply between the source S1 and S2 which may be called a source and a drain of the CMOS transistor and between the anode and the cathode of the diode over an operation range from a low-frequency operation to a high-frequency operation.

In the first embodiment, description has been made about the case where the CMOS transistor is formed on the Si substrate 10. However, this invention is not limited thereto but a P-channel MOS transistor as a single element may be formed. In this case, the source electrode and the drain electrode of the P-channel MOS transistor are connected to the Vcc power supply layer 30 and the GND layer 50, respectively. Alternatively, a N-channel MOS transistor as a single element may be formed on the Si substrate 10. In this case, the drain electrode and the source electrode of the N-channel MOS transistor are connected to the Vcc power supply layer 30 and the GND layer 50, respectively.

In the first embodiment, the anode electrode AE and the cathode electrode CE of the diode Di are connected to the Vcc power supply layer 30 and the GND layer 50, respectively. However, this invention is not limited thereto but the cathode electrode CE and the anode electrode AE of the diode Di may be connected to the Vcc power supply layer 30 and the GND layer 50, respectively.

In the first embodiment, a MOS structure is described with respect to the transistors and the diode. However, this invention is not limited thereto but is applicable to a bipolar structure also.

In the first embodiment, the Si substrate is used as a substrate. However, this invention is not limited thereto but any substrate may be used as far as the semiconductor element can be mounted thereto. For example, a glass substrate or a plastic substrate may be used.

Second Embodiment

Figure 6:
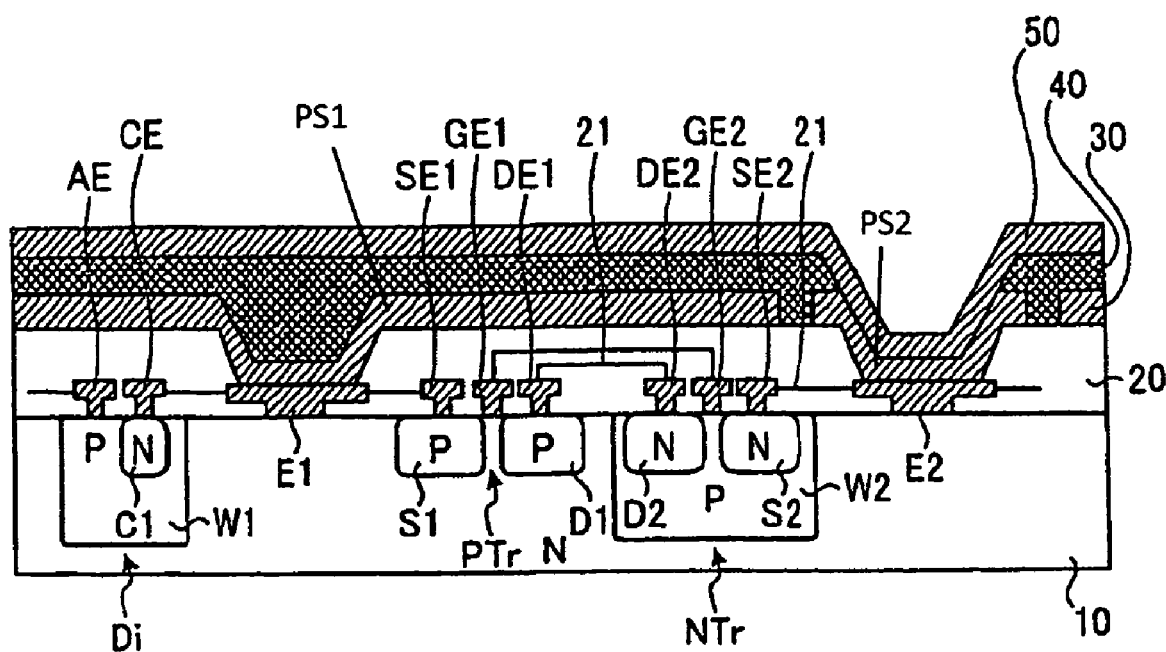
FIG. 6 is a sectional view of a characteristic part of a semiconductor device according to a second embodiment of this invention.
Figure 7A:
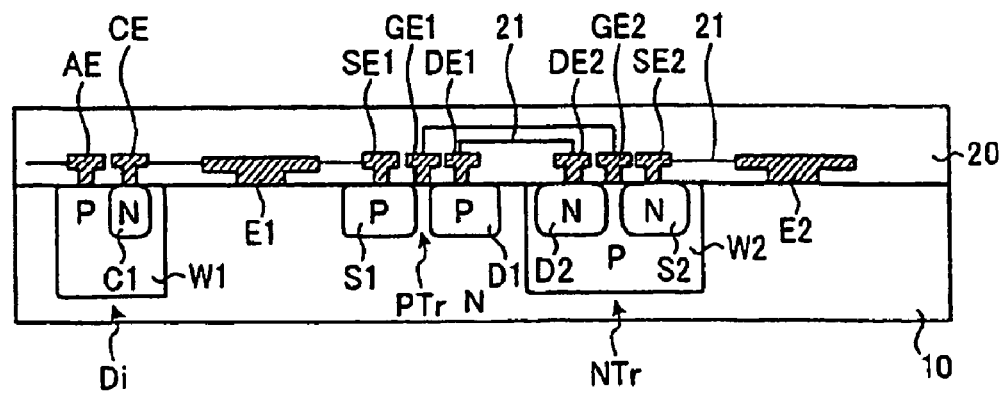
FIGS. 7A to 7E are sectional views for describing a process of producing the semiconductor device according to the second embodiment.
Figure 7B:
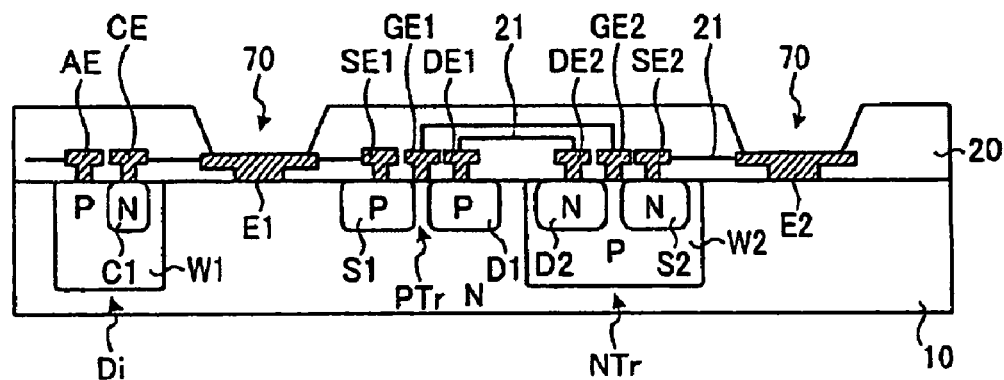
Figure 7C:
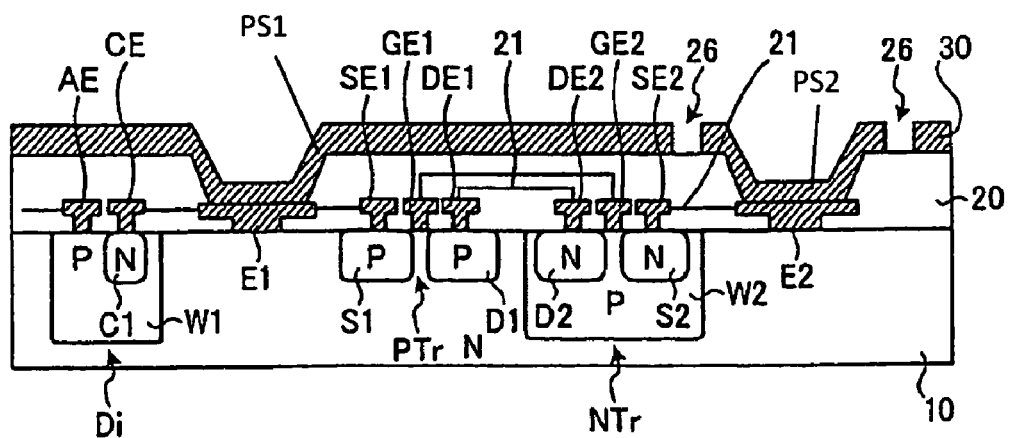
Figure 7D:
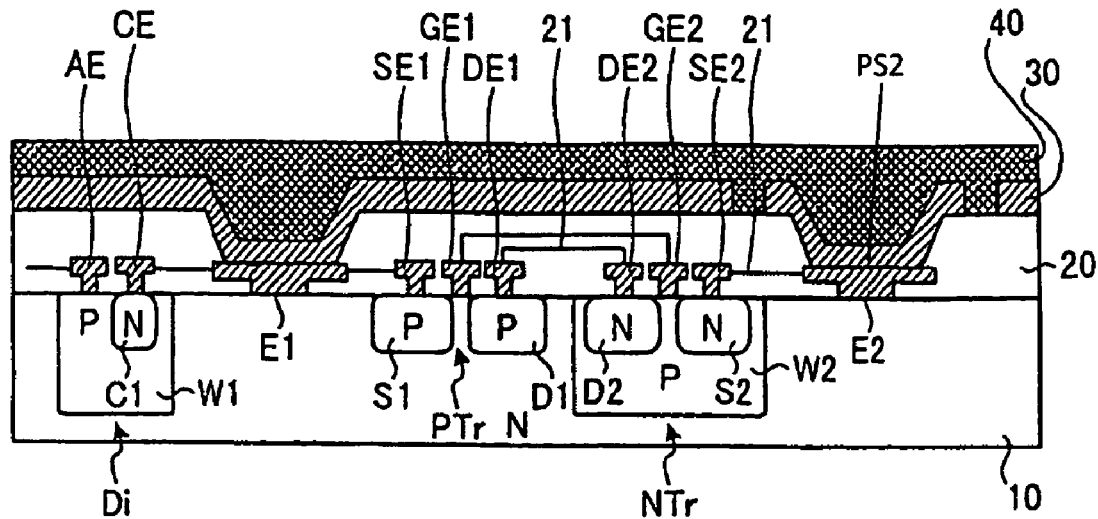
Figure 7E:
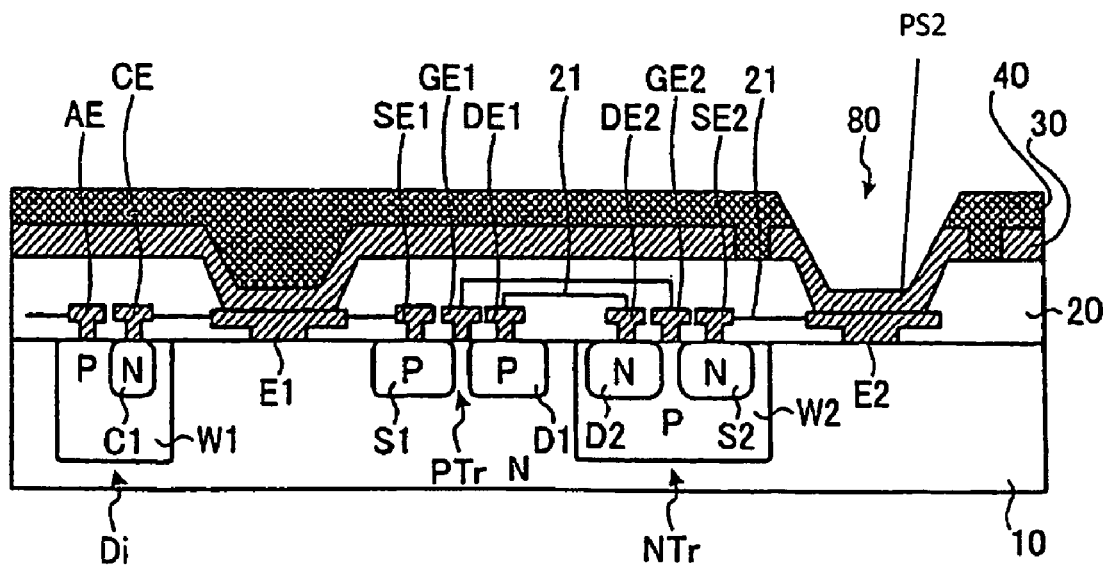

Referring to FIGS. 6 to 7E, a semiconductor device according to a second embodiment of this invention will be described. In the semiconductor device according to the first embodiment, the Vcc power supply layer 30 is formed throughout an entire surface of the Si substrate 10. On the other hand, in the semiconductor device according to the second embodiment, a Vcc power supply layer 30 is separated into sections corresponding to a plurality of predetermined circuit blocks, with the sections including a first power supply layer section PS1 and a second power supply layer section PS2. Similar parts equivalent in functions to those in FIG. 3A are designated by like reference numerals and description thereof will be omitted.

Referring to FIG. 6, an insulating layer 20 is provided with an electrode E1 connected to the Vcc power supply layer 30 and an electrode E2 connected to the GND layer 50. The electrode E1 is connected via a wire 21 to a source electrode SE1 of a P-channel MOS transistor PTr and a cathode electrode CE of a diode Di. The electrode E2 is connected via the wire 21 to a source electrode SE2 of an N-channel MOS transistor NTr and an anode electrode AE (not shown) of a diode Di of a next block.

Referring to FIGS. 7A to 7E, description will be made of a process of producing the semiconductor device illustrated in FIG. 6. At first referring to FIG. 7A, the electrodes AE, CE, SE1, GE1, DE1, SE2, GE2, DE2, E1, and E2 and the wire 21 are formed on the Si substrate 10 by patterning using a metal such as Al. By spin coating, sputtering, CVD, or the like, $SiO_2$ is deposited to form the insulating layer 20.

After the insulating layer 20 is formed, openings 70 for connecting the electrodes E1 and E2 to the Vcc power supply layer 30 are formed in the insulating layer 20 by etching, as illustrated in FIG. 7B.

Next referring to FIG. 7C, a metal such as Al is deposited by sputtering, CVD, or the like in the openings 70 and on a surface of the insulating layer 20 except electrode isolating regions 26 to form the VCC power supply layer 30 having separated regions, specifically the VCC power supply layer 30 being separated into a first power supply layer section PS1 and a second power supply layer section PS2.

After the Vcc power supply layer 30 is formed, a high dielectric constant material is deposited on the Vcc power supply layer 30 by spin coating, sputtering, CVD, or the like to form a high dielectric constant layer 40 as illustrated in FIG. 7D. After the high dielectric constant layer 40 is formed, an opening 80 for connecting the electrode E2 and the power supply layer 30, specifically the second power supply layer section PS2 of the power supply layer 30, to the GND layer 50 is formed.

Thereafter, in the opening 80 and on a surface of the high dielectric constant layer 40, a metal such as Al is deposited by sputtering, CVD, or the like to form the GND layer 50. Thus, the electrode E2 and the Vcc power supply layer 30, specifically the second power supply layer section PS2 of the power supply layer 30, are connected to the GND layer 50 to produce the semiconductor device illustrated in FIG. 6.

Third Embodiment

Figure 8:
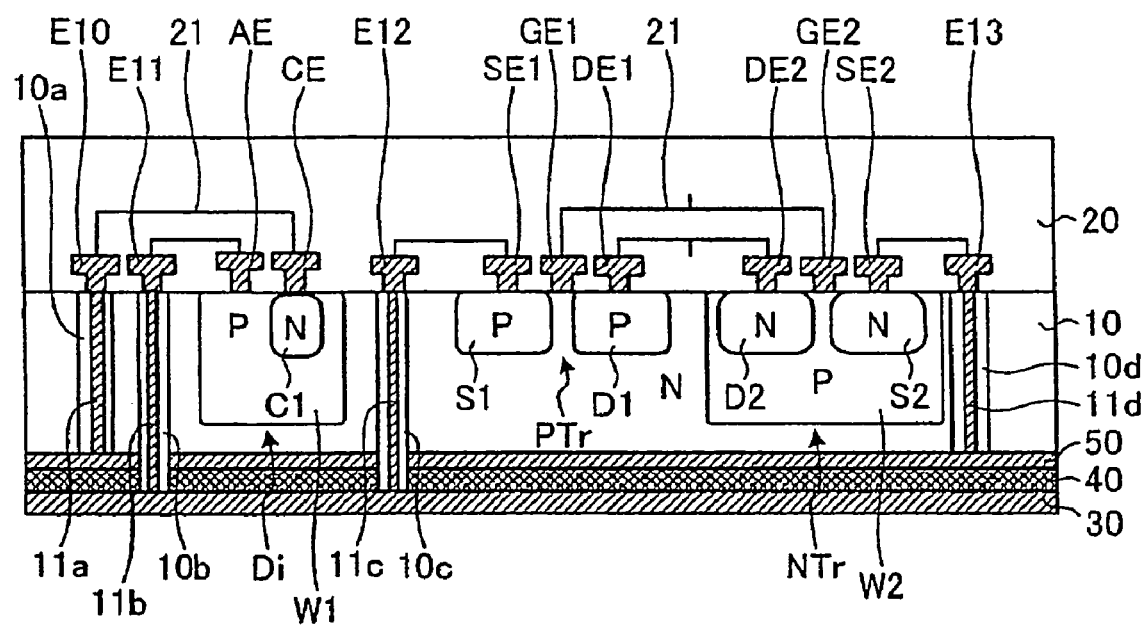
FIG. 8 is a sectional view of a characteristic part of a semiconductor device according to a third embodiment of this invention.

Referring to FIG. 8, a semiconductor device according to a third embodiment of this invention will be described. In the semiconductor device according to the first embodiment, the bypass capacitor is formed on one surface of the Si substrate 10 on which the semiconductor elements are formed. On the other hand, in the semiconductor device according to the third embodiment, a bypass capacitor is formed on the other surface of the Si substrate 10 opposite to the one surface on which the semiconductor elements are formed. The one surface provided with the semiconductor elements and the other surface without the semiconductor elements may be referred to as a first surface and a second surface, respectively.

In FIG. 8, similar parts equivalent in function to those in FIG. 3A are designated by like reference numerals and description thereof will be omitted. In the figure, the Si substrate 10 has a first surface provided with semiconductor elements and a second surface opposite to the first surface and provided with a bypass capacitor comprising a Vcc power supply layer 30, a high dielectric constant layer 40, and a GND layer 50.

An insulating layer 20 is provided with an electrode E10 for connecting the GND layer 50 and a cathode electrode CE, an electrode E11 for connecting the Vcc power supply layer 30 and an anode electrode AE, an electrode E12 for connecting the Vcc power supply layer 30 and a source electrode SE1, and an electrode E13 for connecting the GND layer 50 and a source electrode SE2. The electrodes E10, E11, E12, and E13 are connected via wires 21 to the cathode electrode CE, the anode electrode AE, the source electrode SE1, and the source electrode SE2, respectively.

The Si substrate 10 is provided with contact holes 10a to 10d subjected to insulation processing. The GND layer 50 and the electrode E10 are connected to each other via a wire 11a formed in the contact hole 10a. The Vcc power supply layer 30 and the electrode E11 are connected to each other via a wire 11b formed in the contact hole 10b. The Vcc power supply layer 30 and the electrode E12 are connected to each other via a wire 11c formed in the contact hole 10c. The GND layer 50 and the electrode E13 are connected to each other via a wire 11d formed in the contact hole 10d.

Fourth Embodiment

Figure 9A:
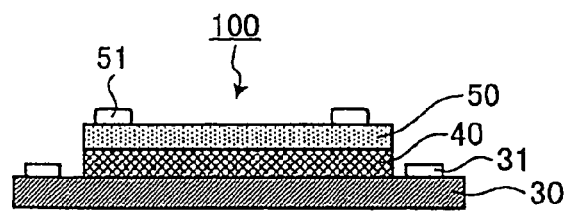
FIG. 9A is a schematic sectional view of a bypass capacitor sheet according to a fourth embodiment of this invention.
Figure 9B:
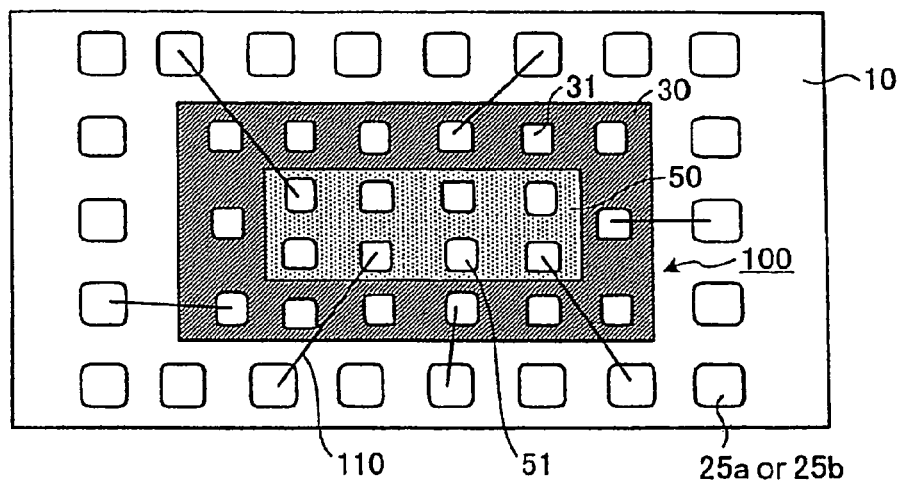
FIGS. 9B and 9C are a schematic plan view and a schematic sectional view of the bypass capacitor sheet in FIG. 9A when it is mounted to an Si substrate, respectively.
Figure 9C:
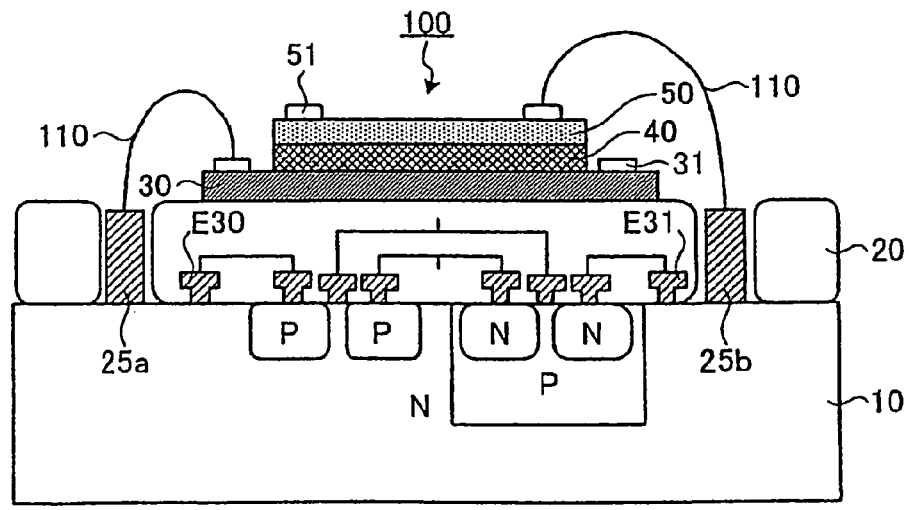

Referring to FIGS. 9A to 9C, a semiconductor device according to a fourth embodiment of this invention will be described. In the semiconductor device according to each of the first through the third embodiments, the bypass capacitor is formed by laminating a plurality of layers on the Si substrate 10. On the other hand, in the semiconductor device according to the fourth embodiment, a bypass capacitor has a sheet-like module structure. In the figures, similar parts equivalent in function to those in FIG. 3A are designated by like reference numerals and description thereof will be omitted.

Referring to FIGS. 9A to 9C, a bypass capacitor having a module structure is illustrated as a bypass capacitor sheet 100. The bypass capacitor sheet 100 is smaller in area than an Si substrate 10. The bypass capacitor sheet 100 comprises a Vcc power supply layer 30, a high dielectric constant layer 40, and a GND layer 50. The Vcc power supply layer 30 is greater in area than the high dielectric constant layer 40 and the GND layer 50 and is exposed at its periphery.

At the periphery of the Vcc power supply layer 30, a plurality of pads 31 are formed. The GND layer 50 is provided with a plurality of pads 51 formed on its surface. The Si substrate 10 is provided with a plurality of Vcc pads 25a and a plurality of GND pads 25b formed at its periphery. The Vcc pads 25a are electrically connected (not shown) to the electrode E30 and the GND pads 25b are connected (not shown) to an electrode E31.

In case where the bypass capacitor sheet 100 is mounted on the Si substrate 10, the pads 31 of the Vcc power supply layer 30 and the Vcc pads 25a of the Si substrate 10 are connected by bonding wires 110. Similarly, the pads 51 of the GND layer 50 and the GND pads 25b of the Si substrate 10 are connected by bonding wires 110.

According to the fourth embodiment, the bypass capacitor has a sheet-like module structure. Therefore, a production process of the semiconductor device can be simplified and the semiconductor device can be reduced in weight.

Fifth Embodiment

Figure 10A:
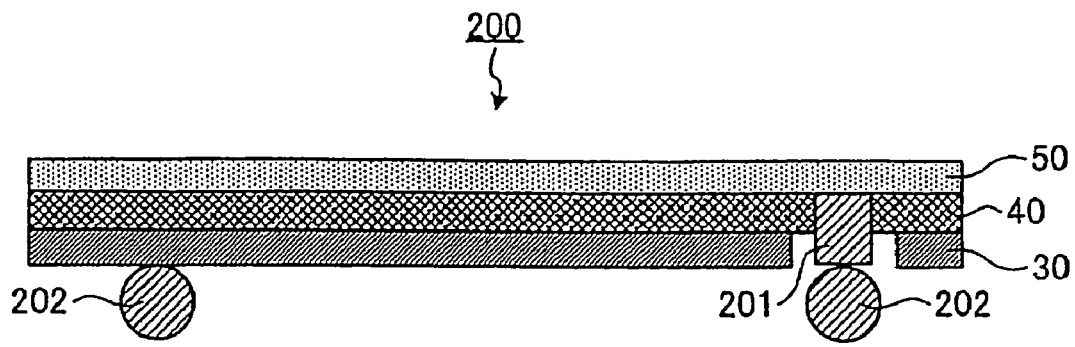
FIG. 10A is a schematic sectional view of a bypass capacitor sheet according to a fifth embodiment of this invention.
Figure 10B:
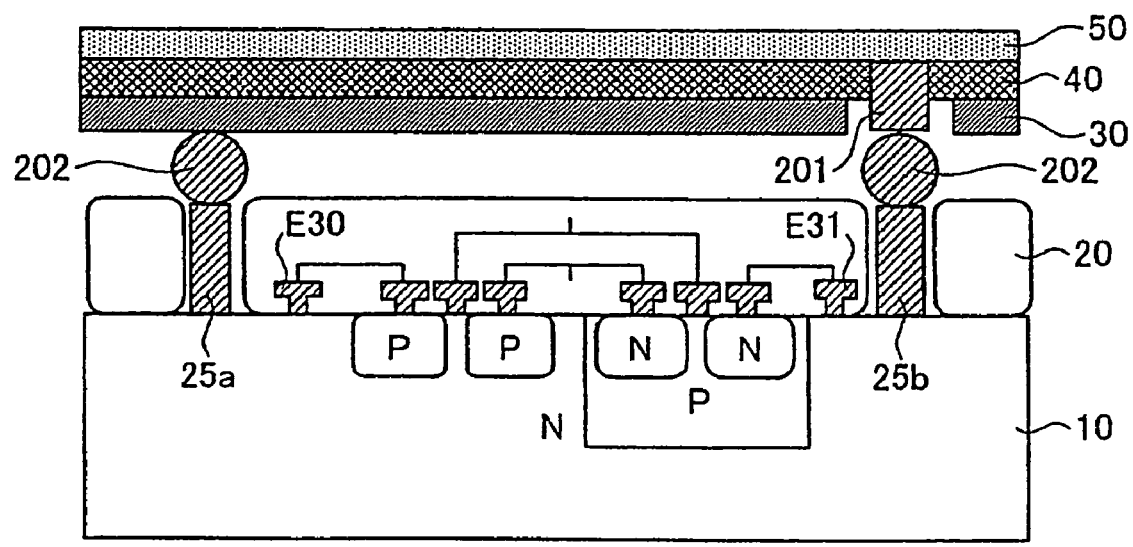
FIG. 10B is a schematic sectional view of the bypass capacitor sheet in FIG. 10A when it is mounted to an Si substrate.

Referring to FIGS. 10A and 10B, a semiconductor device according to a fifth embodiment will be described. In the fourth embodiment, the bypass capacitor sheet is connected to the Si substrate by the bonding wires. On the other hand, in the fifth embodiment, a bypass capacitor sheet is connected to an Si substrate by solder balls.

In FIGS. 10A and 10B, similar parts equivalent in function to those in FIGS. 9A to 9C are designated by like reference numerals and description thereof will be omitted.

Referring to FIGS. 10A and 10B, a bypass capacitor having a module structure is illustrated as a bypass capacitor sheet 200. The bypass capacitor sheet 200 has an area substantially equal to that of an Si substrate 10. The bypass capacitor sheet 200 comprises a Vcc power supply layer 30, a high dielectric constant layer 40, and a GND layer 50. Under the Vcc power supply layer 30, a plurality of solder balls 202 are arranged. The GND layer 50 is provided with a plurality of pads 201 extending downward. The pads 201 are connected to the solder balls 202.

The Si substrate 10 is provided with a plurality of Vcc pads 25a and a plurality of GND pads 25b. The Vcc pads 25a are connected (not shown) to an electrode E30 and the GND pads 25b are connected (not shown) to an electrode E31.

In case where the bypass capacitor sheet 200 is mounted on the Si substrate 10, the solder balls 202 of the bypass capacitor sheet 200 are connected by reflowing to the Vcc pads 25a and the GND pads 25b of the Si substrate 10. Herein, the solder balls 202 are formed on the bypass capacitor sheet 200. Alternatively, the solder balls may be formed on the Vcc pads 25a and the GND pads 25b of the Si substrate 10.

The semiconductor device and the bypass capacitor module according to this invention are applicable to various kinds of semiconductor devices, such as an IC, an LSI, and a VLSI.

Although this invention has been described in conjunction with the several exemplary embodiments thereof, this invention is not limited to the foregoing embodiments but may be modified in various other manners within the scope of the appended claims.

What is claimed is:

1. A semiconductor device including a substrate having a first surface and a second surface opposite to the first surface;
    a semiconductor element formed on the first surface of the substrate;
    first and second electrodes which are formed directly on the first surface of the substrate, which are electrically connected to the semiconductor element, and which are separated from each other;
    an insulating layer formed on the first surface of the substrate;
    a power supply layer comprising:

a first power supply layer section directly and electrically connected to the first electrode and extended on the insulating layer; and a second power supply layer section directly and electrically connected to the second electrode and electrically isolated from the first power supply layer section by electrode isolating regions which separate the first power supply layer section from the second electrode;

a high dielectric constant layer formed on the first power supply layer section and filling the electrode isolating regions; and a ground layer which is connected to the second power supply layer section and which is coated on the entirety of the high dielectric constant layer;

wherein:

the power supply layer, the high dielectric constant layer, and the ground layer form a bypass capacitor.

2. The semiconductor device according to claim 1, wherein the first power supply layer section and the second power supply layer section form a plurality of circuit blocks, respectively.

3. The semiconductor device according to claim 1, wherein the semiconductor element is a diode having an anode electrode connected to one of the power supply layer and the ground layer and a cathode electrode connected to the second power supply layer section and the ground layer.

4. The semiconductor device according to claim 1, wherein the high dielectric constant layer has a dielectric constant not smaller than 10.

5. The semiconductor device according to claim 1, wherein the bypass capacitor has a module structure.

* * * * *